United States Patent
Schroeder et al.

(10) Patent No.: US 6,621,839 B1
(45) Date of Patent: Sep. 16, 2003

(54) METHOD FOR CONTACTING A HIGH-POWER DIODE LASER BAR AND A HIGH-POWER DIODE LASER BAR-CONTACT ARRANGEMENT OF ELECTRICAL CONTACTS WITH MINOR THERMAL FUNCTION

(75) Inventors: Matthias Schroeder, Stadtroda (DE); Hartmut G. Haensel, Ilmnitz (DE); Dirk Lorenzen, Jena (DE)

(73) Assignee: Jenoptik Aktiengesellschaft, Jena (DE)

( * ) Notice: Subject to any disclaimer, the term of this patent is extended or adjusted under 35 U.S.C. 154(b) by 168 days.

(21) Appl. No.: 09/827,538

(22) Filed: Apr. 6, 2001

(30) Foreign Application Priority Data

Apr. 7, 2000 (DE) .......................... 100 18 043

(51) Int. Cl.[7] .............................. H01S 3/04
(52) U.S. Cl. .......................... 372/36; 372/50
(58) Field of Search ................ 372/36, 75, 43, 372/50

(56) References Cited

U.S. PATENT DOCUMENTS 5,325,384 A * 6/1994 Herb et al. ............... 372/36
6,072,814 A * 6/2000 Ryan et al. ............... 372/43
6,259,713 B1 * 7/2001 Hwu et al. ............... 372/36
6,295,307 B1 * 9/2001 Hoden et al. ............. 372/36
6,327,285 B1 * 12/2001 Wang ..................... 372/36

* cited by examiner

Primary Examiner—Albert W. Paladini
(74) Attorney, Agent, or Firm—Reed Smith LLP

(57) ABSTRACT

A method is disclosed for joining an electrical contact of minor thermal function to a high-power diode laser bar, comprises the step of joining the contact and the HDB by a joining material containing an adhesive. A high-power diode laser bar-contact arrangement comprises a high-power diode laser bar, an electrical contact of minor thermal function and a joint zone between the HDB and the contact. The joint zone contains a joining material with an adhesive. The disclosure also describes a high-power diode laser comprising an HDB, two electrical contacts of minor thermal function and two joint zones between the contacts and the HDB. The joint zones contain joining materials with adhesives. A high-power diode laser stack is also described.

9 Claims, 7 Drawing Sheets

METHOD FOR CONTACTING A HIGH-POWER DIODE LASER BAR AND A HIGH-POWER DIODE LASER BAR-CONTACT ARRANGEMENT OF ELECTRICAL CONTACTS WITH MINOR THERMAL FUNCTION

BACKGROUND OF THE INVENTION a) Field of the Invention

The invention is directed to a method for contacting a high-power diode laser bar and a high-power diode laser bar-contact arrangement of electrical contacts with minor thermal function.

b) Description of the Related Art

High-power diode laser bars (HDBs) are semiconductor laser components of at least two semiconductor laser emitters of high optical output power which work essentially optically independent from one another. Their average optical line output densities exceed 1 watt/mm component width, their optical output power exceeds 10 watts cw per component. The reflection surfaces of the semiconductor laser resonators or cavities are called 'facets' and can be reflection-coated or antireflection-coated. HDBs are typically formed of a doped semiconductor substrate of a thickness of 10 or 100 $\mu$m on which a pn junction has been epitaxially grown. HDBs have two electrodes—an anode and a cathode—located on the substrate side and epitaxy side with respect to the HDB. Individual operation of single emitters is made possible by constructing the electrode so as to be electrically separated on the epitaxy side with respect to the emitter. The electrodes of an HDB can have metallization, but may also not be metallized.

HDBs must be contacted in order to operate. A contact by which an HDB is connected can realize different functions. These functions may include: supply of current to the HDB, dissipation of heat from the HDB and mechanical fixing of the HDB. The contact can perform its function for HDBs particularly well when the connection between the contact and the HDB is a material engagement. In the following, by electrical contact for the HDB is also meant the plurality of contact bodies which have the same electrical polarity and are at a distance from one another spatially. In this sense, for example, a series of electric bond wires at the cathode of the HDB forms an individual electrical (n-)contact. Likewise, a series of conductor paths on ceramic, for example, which are provided for epitaxy-side contacting of the HDB with its anodes which are provided for individual operation of the emitters forms an individual electrical (p-)contact. An electrical contact for an HDB can accordingly comprise a plurality of mechanical contacts.

By high-power diode laser (HDL) is meant an HDB which is connected in a material engagement with an electrically positive (p-)contact at the anode of the HDB and an electrically negative (n-)contact at the cathode of the HDB. By definition, the HDB of an HDL has exactly two electrical contacts—a positive and a negative contact—which are fixed to the HDB at the epitaxy side and substrate side.

During operation of the HDL, the HDB also generates, in addition to optical output, considerable thermal output (losses), particularly in the area of the pn junction of its emitter near the epitaxy side of the HDB. The electrical contacts of the HDB take on a thermal function in addition in that thermal output of the HDB is dissipated through them. If both electrical contacts of the HDL have the same thermal resistance, more thermal output (heat) is dissipated via the epitaxy-side contact than via the substrate-side contact.

An electrical contact for the HDB is defined as an electrical contact with major thermal function when more than one third of the thermal output generated in the HDB in continuous wave (cw) operation is dissipated through it. An electrical contact for the HDB is defined as an electrical contact with minor thermal function when, at most, one third of the thermal output generated in the HDB in cw operation is dissipated through it.

According to this definition, an HDB which is operated in cw mode requires at least one electrical contact with relevant thermal function. Operating in pulsed mode, both electrical contacts can have minor thermal function by definition insofar as the thermal output averaged over time does not exceed two thirds of the value of the thermal peak output in the pulse.

An example of an electrical contact with relevant thermal function is a metallized diamond body to which the HDB is soldered over a large area on the epitaxy side and through which 90% of the heat that is produced in the HDB during operation is dissipated.

An example of an electrical contact with minor thermal function is a series of bond wires which have been bonded to the substrate-side metallized electrode of the HDB and through which 1% of the heat produced in the HDB is dissipated in cw operation.

Another example of an electrical contact with minor thermal function is a copper-tungsten substrate to which the HDB has been soldered on the epitaxy side and through which 31.5% of the pulse peak heat output produced in the HDB or 90% of the heat output produced in the HDB averaged over time is dissipated in pulsed operation with a duty factor of 35% averaged over time.

The material-engagement connection of an HDB and an electrical contact involves a more or less highly pronounced joint zone between the two connection members. The material-engagement assembly between an HDB and an electrical contact is carried out in a material-engagement assembly process, a joining process, by a joining method. The joining process can be carried out using an additional joining material.

The joining process starts when the joint members are brought into contact with one another or with an additional joining material. It is finished when a material-engagement connection is achieved whose properties perform the intended function for which it is produced. These properties may include: sufficient electric conductivity, sufficient thermal conductivity, sufficient mechanical strength.

Joining processes for connecting the HDB with electrical contacts with minor thermal function according to the prior art are bonding and soldering.

Arrangements of HDBs and an electrical contact of minor thermal function according to the prior art have a joint zone between the HDB and electrical contact which is constructed as a bonding weld or solder joint. The joint zones differ depending on the joining method in that the joint zone between the HDB and electrical contact is formed by an additional joining material, the solder, in the case of soldering, whereas with bonding, the joint zone requires no additional joining material.

With bonding, the electrical contact, for example, one or more bond wires, is connected with the HDB by its metallization through local ultrasound, pressure and/or heat action. The mechanical forces occurring locally during the bonding process can overload and damage the HDB. Because of the small diameter of bond wires and the high currents occurring during the operation of the HDL, the HDB must be connected with large number of bond wires which can only be arranged sequentially. The contacting of the HDB with bond wires is also disadvantageous in that the HDB must be provided with a particularly thick metallization to compensate for the inhomogeneous input of current into the HDB. Finally, wire bonding processes result in an increased space requirement around the HDB. This is disadvantageous for the flexibility of the assembly process as well as for the capacity of the HDL to be integrated in systems.

During soldering, a material-engagement connection between the metallization of the HDB and the metallic or metallized electrical contact is achieved with the assistance of a soldering material. The connection relies on diffusion processes between the solder material and the metallization materials of the HDB and electrical contact. The diffusion processes start immediately after the metals and solder are brought into contact at a melting temperature of the solder or eutectic temperature of the metal and solder.

The soldering process is disadvantageous because of the required heat action and its consequences: The two joint members, namely, the HDB and the electrical contact, generally have different thermal expansion coefficients. When cooled below the solidification temperature of the solder joint at room temperature or operating temperature, mechanical stresses are introduced into the HDB which are detrimental with respect to the lifetime of the HDB. High mechanical stresses occur especially using solder connections of the HDB with a large-area contact. Stress-reducing soft solders in turn have a tendency toward electromigration which are likewise detrimental to a sufficient lifetime of the HDB.

The use of hard solders which are resistant to electromigration and The use of electrical contacts having the same expansion coefficient as the HDB material limits the choice of possible electrical contacts on the one hand and, on the other hand, also requires very high soldering temperatures that could harm the HDB.

Applying solder to one of the joint members prior to soldering is a cumbersome technique: it is generally carried out by sputtering, evaporation or electro-plating of the electrical contact.

A substantial disadvantage consists in that all soldering processes require the use of a flux or a forming gas as reducing agent for the solder material in order to produce a reliable solder connection between the joint members. However, these agents can harm the sensitive facets of the HDB through chemical attack. Therefore, it is extremely desirable to dispense with additional gaseous or liquid substances in the joining process.

Finally, both the soldering process and wire bonding process require metallization of the joint members, especially of the HDB. This metallization is an additional costly process in HDB fabrication.

However, the essential advantage of a solder connection, namely, a good thermal bonding of a heat-generating joint member to a heat-dissipating joint member, is not valid when connecting an HDB with an electrical contact of minor thermal function.

The disadvantages of solder connections can be summarized as follows: A solder connection always induces a disadvantageous amount of mechanical stresses in the HDB. Mechanical stresses notwithstanding, the connection has increased susceptibility to electromigration. Reducing agents for the solder material must be used in order to prevent voids and for long-term stability and pose a risk for the facets.

It is generally disadvantageous in prior art joining processes for an HDB and an electrical contact of minor thermal function that the joining process for material-engagement connections between the contact and HDB produces a microstructural change in the metallization of the HDB which exposes the HDB to detrimental mechanical stresses depending on the method and/or requires the use of gaseous or liquid chemical accessories against whose harmful influence the HDB can only be insufficiently protected.

A disadvantage in the joint zones of material-engagement HDB contact arrangements with an electrical contact of minor thermal function according to the prior art consists in that, due to the nature of the joint zones of the members, namely, the HDB and the contact, the HDB is exposed to harmful mechanical stresses or its facets are exposed to damaging chemical influences during production of the connection.

OBJECT AND SUMMARY OF THE INVENTION

It is the primary object of the invention to provide a joining process for a material-engagement connection of an HDB and an electrical contact of minor thermal function which does not have the disadvantages of conventional material-engagement connections or the disadvantageous influences of conventional material-engagement connecting processes.

It is a further object of the invention to provide an HDB-contact arrangement with an electrical contact of minor thermal function with a joint zone which does not have the disadvantages of conventional joint zones in HDB-contact arrangements with an electrical contact of minor thermal function.

According to the invention, the above objects are met by a joining process which connects the HDB and electrical contact of minor thermal function with one another in an adhesion process by means of adhesives.

According to the invention, the above objects are met by an HDB-contact arrangement with an electrical contact of minor thermal function whose joint zone contains a joining material with an adhesive.

The solution according to the invention comprising an adhesive connection of the contact and HDB is advantageous due to the lack of mechanical stresses in the joint zone. The adhesive connection process begins when the joint members are brought into contact with adhesives of the joining material. The joining process ends when the properties of the joint zone necessary to fulfill the function of the connection are achieved. The joining process can be carried out at room temperature and therefore can be effected without mechanical stresses for the laser. It can take place at the operating temperature of the laser and therefore enables laser operation without mechanical stresses.

The joining process can also be carried out at increased temperature in order to accelerate the joining process and/or to improve the properties of the joint zone. In this regard, it is assumed that the joining material containing the adhesive limits the thermomechanical stresses developing between the joint partners through a flux process due to plastic properties with sufficient thickness of the joint zone during subsequent cooling.

It may be advantageous when, in addition to the adhesive, the joining material contains electrically conducting material, for example, a metallic filler, which improves the electrical connection between the contact and HDB.

With regard to the properties of a possible filler, good thermal conductivity is not a primary concern since the electrical contact to be joined only has minor thermal importance.

By contrast, it can be advantageous in certain cases when the joining material contains no other components apart from the adhesive. In this way it is possible to achieve very slender joint zones by which a very good electrically conductive connection can be achieved between the electrical contact and the HDB, even when using a nonmetal adhesive, for example, when the thickness of the joint zone is in the range of the surface roughness of the joint members. A preferred construction of the adhesive connection can dispense with a solderable metallization of the HDB such as gold, for example, and can also dispense with the contact because an adhesive does not necessarily require this. Depending on the type of adhesive and fillers of the adhesive joining material, a diffusion barrier layer such as is common in soldering may also possibly be omitted.

A joining material with adhesives can be applied directly to one of the joint members relatively easily by a simple device without requiring technically complicated machines as in solder vapor-deposition or bonding.

The use of joining materials with adhesives for connecting an HDB and an electrical contact of minor thermal function is possible particularly because essential factors favoring the adhesive connection result solely from the given factors of the HDB and electrical contact as well as from the necessary conditions for operation of an HDL.

Adhesive-containing joining materials usually have an appreciably lower thermal conductivity than solder materials. However, the use of the adhesive-containing joining material for connecting an HDB and an electrical contact of minor thermal function does not necessitate transfer of substantial heat outputs and therefore does not require good thermal conductivity.

Joining materials containing adhesives usually also have quite poor electrical conductivity even with the addition of electrically conductive filler materials. However, when using large-area, parallel joint planes between the HDB anode or cathode and electrical contact, the joint zone is very extended and its thickness can be kept very small, i.e., less than 100 µm. Therefore, the electric resistance of the joint zone is also small.

Joining materials containing adhesives often have a glass transition temperature which is quite low at about 100° C. and are therefore excluded from high temperature applications. In spite of its low electrical resistance, several hundred milliwatts to several watts of heat output can be produced in the joint zone containing adhesives because of the high operating currents of the HDL, which poses a threat of overheating the joint zone. However, the HDB, as an electro-optic component which produces extensive heat and is extremely sensitive to temperature, also should not be exposed to high temperatures. Therefore, it is well cooled in cw operation from one side via the electrical contact with relevant thermal function. Since the HDB substrate is very thin in relation to its surface, the side remote of the electrical contact with major thermal function, where the adhesive-containing joint zone for electrical contact of minor thermal function is also located, is well cooled. The operating temperature of the HDB is usually well below 100° C. and typically ranges from about 50 to 70° C. The joint zone produces only a small fraction of the entire heat that is produced in the HDB. Therefore, the adhesive-containing joint zone is at most negligibly warmer during operation than the source of heat in the HDB.

Joining materials containing adhesives are often hygroscopic. The HDB which is also sensitive to moisture must be protected against condensation, especially at low temperatures. For this purpose, the HDL is often installed in a dry or hermetically sealed housing. This dry environment for the HDB also protects the joint zone containing adhesives.

The joining process according to the invention and the HDB-contact arrangement according to the invention will be described in the following with reference to four embodiment examples.

DESCRIPTION OF THE PREFERRED EMBODIMENTS

Figure 1:
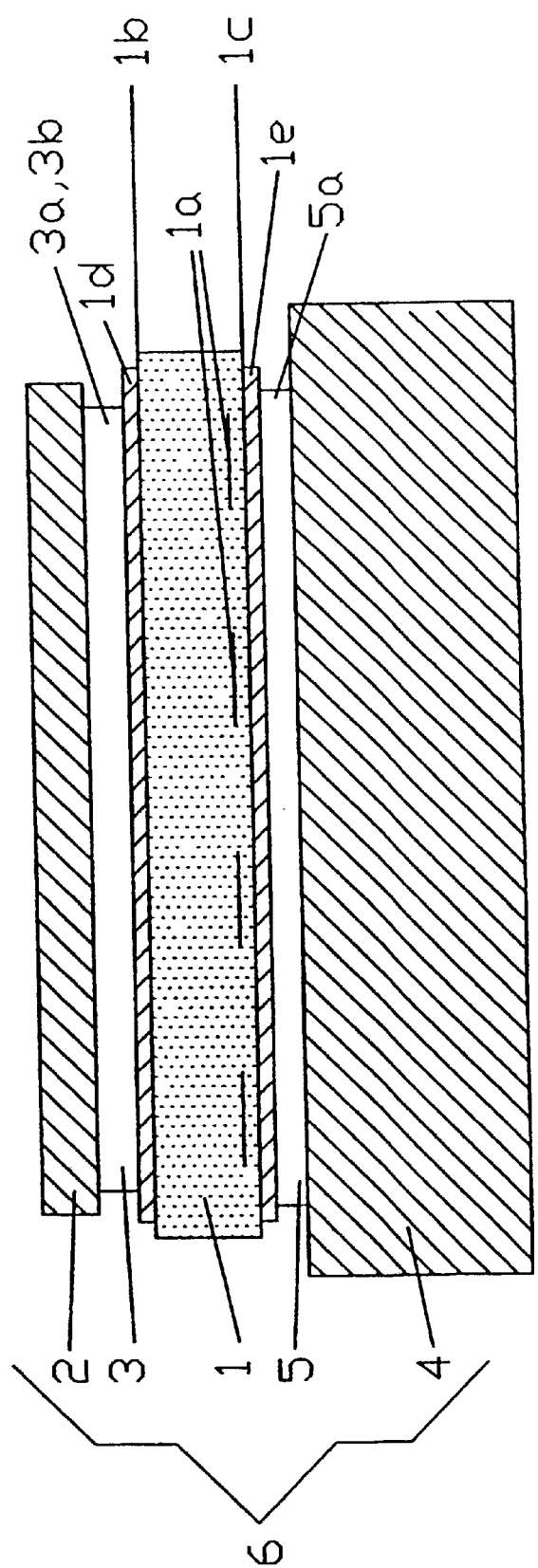
FIG. 1 shows a first embodiment example of an arrangement, according to the invention, of an HDL comprising an electric n-contact, an HDB and a joint zone containing adhesives which connects the two together.

The first embodiment example shown in FIG. 1 shows an HDL (6) with an HDB (1) comprising an n-doped GaAs substrate with a thickness of 100 µm on which a ternary or quaternary semiconductor heterostructure functioning as a pn junction to laser emitters (1a) formed with a terminating p-doped GaAs film has been epitaxially grown. The substrate-side or n-side surface is the cathode (1b) of the HDB and the epitaxy-side or p-side surface is the anode (1c). The cathode has a metallization (1d) and the anode has a metallization (1e). The HDB (1) is soldered p-side-down to a heat sink (4) by means of a solder (5a) via solder joint (5), this heat sink (4) constituting an electrical p-contact with major thermal function. A metal film (2) of copper having a thickness of about 50 µm is the n-side-electrical contact of minor thermal relevance of the HDB.

An electrically conductive glue (3b) as adhesive-containing joining material (3a) is applied to the n-side metallization of the HDB as adhesive-containing joining material (3a). Both joint members, namely, the HDB (1) and the metal film (2), are brought into contact with one another by means of the joining material (3a) at room temperature in that the metal film (2) is pressed into the joining material (3a) applied to the HDB (1). The thickness of the joint zone (3) is about 20 μm. The joining process is continued in that the elements are stored at an elevated temperature of about 100° C. A curing of the glue (3b) is carried out, leading to the material-engagement connection of the joint members. Since metal foil is thin compared with the HDB (1) and the plastic joint zone (3) of the gluing gap adequately thick, no damaging thermomechanical stresses are transmitted to the HDB (1) during the cooling-down of the HDL (6) at the conclusion of the joining process.

A preferred variant of this first embodiment example consists in that the metallization (1d, 1e) of the HDB (1) are eliminated.

Figure 1A:
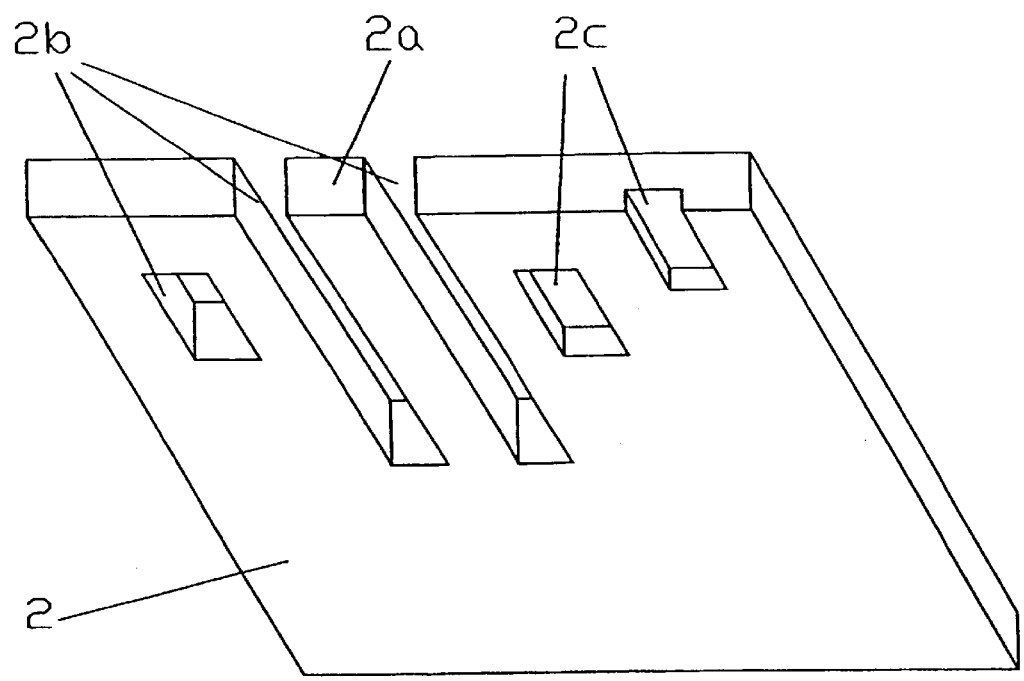
FIG. 1a shows an advantageous construction of the electric n-contact of the first embodiment example.

Preferred variants for the n-contact of this first embodiment example are illustrated in FIG. 1a and consist in that openings (2b) or recesses (2c) in the form of grooves or notches are introduced in the metal film (2) and can absorb the excess joining material. Accordingly, despite inaccurate doping, a sufficiently thin glue joint can be achieved without the risk of joining material overflowing in front of the facet of the HDB. A plurality of openings (2b) next to one another can outfit the n-contact with contact leads (2a) which, moreover, increase the flexibility of the metal film.

Figure 1B:
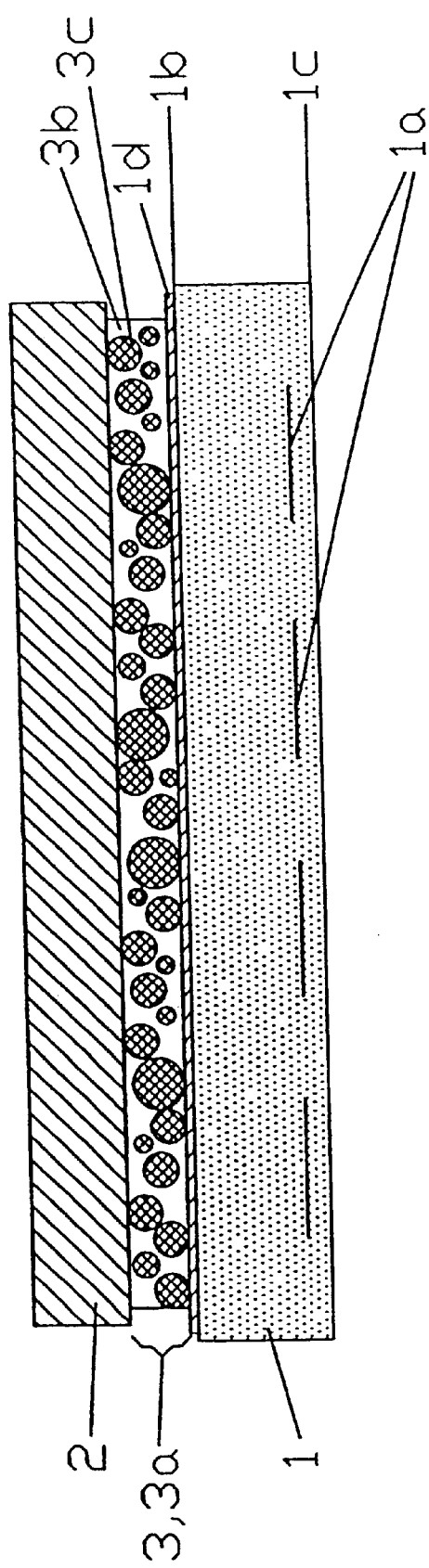
FIG. 1b shows a first advantageous construction of the adhesive-containing joint zone of the first embodiment example.

A preferred variant of the first embodiment example is shown in FIG. 1b and includes the use of a joining material (3a) in the joint zone (3) which, apart from the glue (3b) which is no longer necessarily electrically conductive, contains in addition a metal filler of small silver particles ranging in size from about 10 μm to a maximum of 20 μm (3c). This addition lowers the electrical resistance of the joint zone. The thickness of the joint zone is set at about 20 μm in that the two joint surfaces of the contact members press against one another, due to the largest silver particles in the adhesive.

Figure 1C:
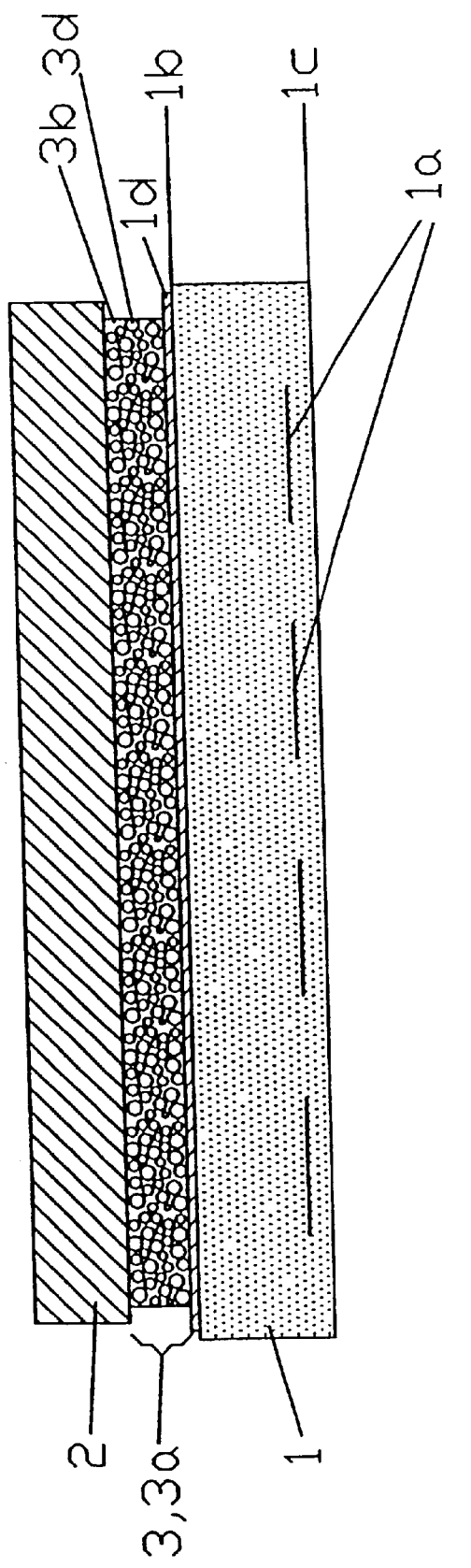
FIG. 1c shows a second construction of the adhesive-containing joint zone, according to the first embodiment example.

Another preferred variant of the first embodiment example is shown in FIG. 1c and, with the same joint zone thickness, uses only silver particles (3d) smaller than 5 μm instead of silver particles (3c) ranging in size from 10 μm to 20 μm. In this way, it is possible to prevent excessive contact pressing pressure at points by the silver particles on the HDB when the thickness of the joint zone (20 μm) is appreciably greater than the particle size (5 μm).

Figure 2:
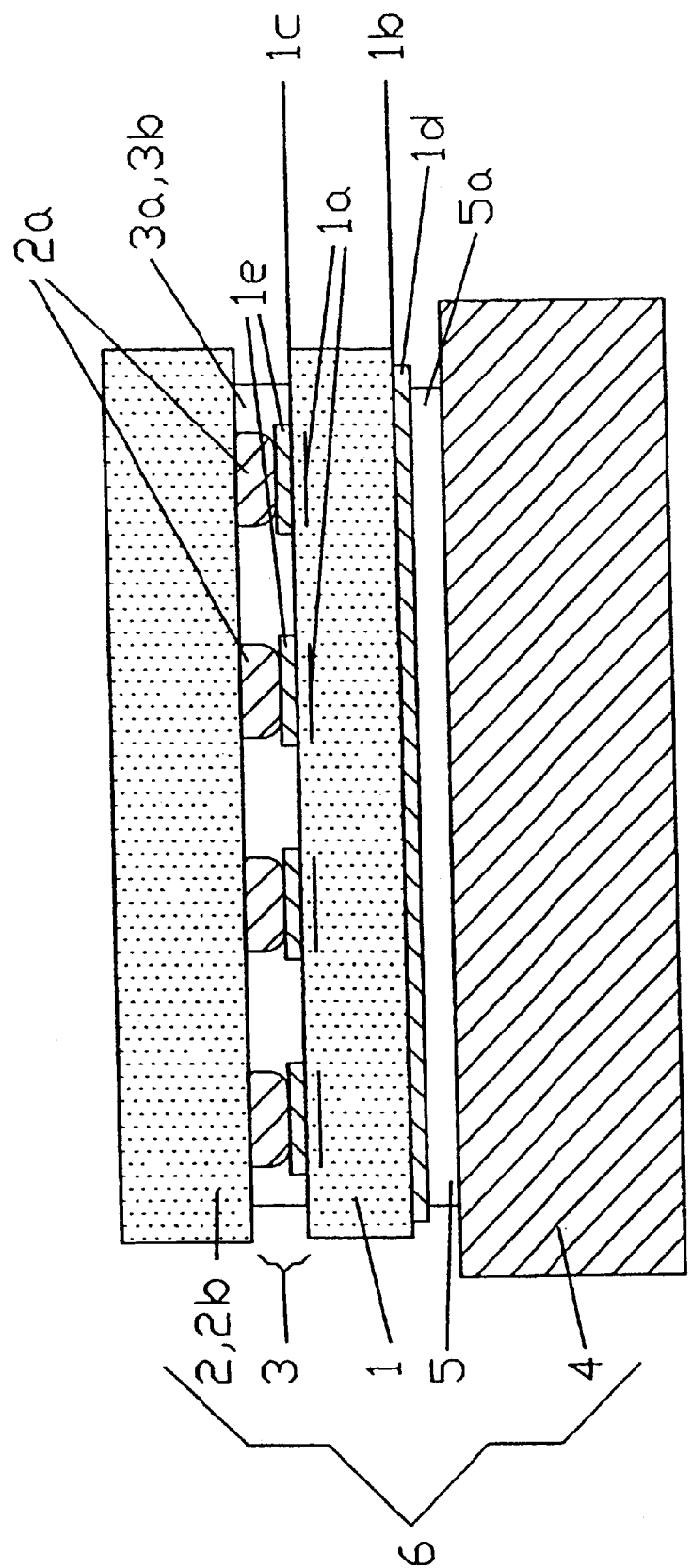
FIG. 2 shows a second embodiment example of an arrangement, according to the invention, of an HDL of addressable emitters comprising an electrical p-contact, an HDB and an adhesive-containing joint zone which connects the two together.

The second embodiment example shown in FIG. 2 shows an HDL (6) with an HDB (1) of addressable emitters (1a) which comprises an n-doped GaAs substrate having a thickness of approximately 100 μm and on which a ternary or quaternary semiconductor heterostructure with the function of a pn junction to laser emitters (1a) formed with terminating p-doped GaAs layer has been epitaxially grown. The substrate-side (n-side) surface is the cathode (1b) of the HDB and the epitaxy-side (p-side) surface is the anode (1c). The cathode has a metallization (1d) and the anode has metallization (1e) for each emitter. The HDB (1) is soldered p-side-up on the substrate side by means of a solder (5a) via a solder joint (5) to a heat sink (4) which is an electrical n-contact with relevant thermal function. An aluminum ceramic substrate (2b) with conductor paths of thick-film gold (2a) with a height of approximately 20 μm for each emitter is the p-side electrical contact (2) of minor thermal relevance of the HDB (1).

An electrically insulating conductive adhesive (3b) is arranged on the p-side metallization of the HDB as adhesive-containing joining material (3a). Both joint members, namely, the HDB (1) and the metallized ceramic (2), are brought into contact with one another by displacement of the joining material (3a) at room temperature in that the conductor paths (2a) contact the metallization (1e) of the HDB (1) due to their respective surface roughness. The thickness of the joint zone (3) lies between the two metallization in the order of magnitude of the surface roughness. Between the conductor paths (between the emitters), the thickness of the joint zone is approximately the thickness of the conductor paths (20 μm). The glue (3b) is cured at room temperature, resulting in the material-engagement connection of the joint members. Also, with curing at elevated temperature, hardly any detrimental stresses would be transmitted to the HDB during cooling of the HDL (6) at the conclusion of the joining process, because the aluminum oxide of the substrate has an expansion coefficient similar to that of GaAs.

Figure 2A:
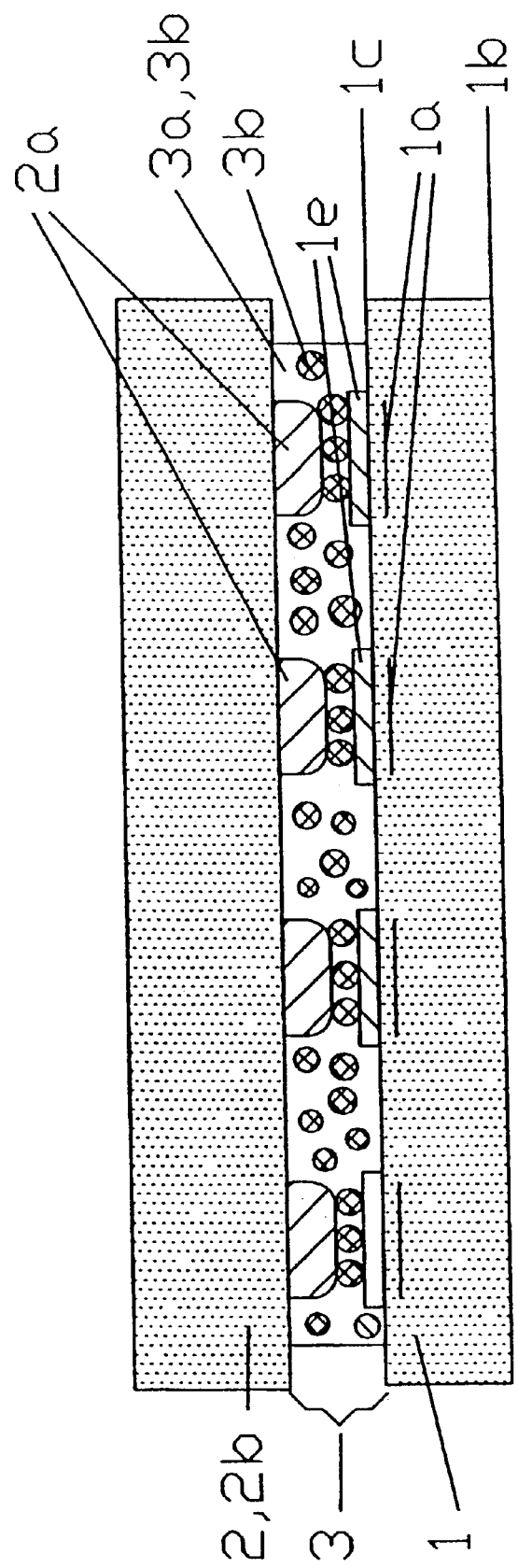
FIG. 2a shows an advantageous construction of the adhesive-containing joint zone of the second embodiment example.

A preferred variant of this second embodiment example can lead to an improvement in the electric transition in the joint zone between the conductor path (2a) and anode metallization (1e). This is illustrated in FIG. 2a and consists in adding a metallic filler of small, finely distributed silver particles (3c) with a size of 10 μm to the electrically insulating glue (3b) of the joining material. This addition reduces the electrical resistance of the joint zone (3) between the conductor paths (2a) and anode metallization (1e) when the thickness of the joint zone is adjusted to the size of the silver particles and the silver particles are accordingly brought into contact with both joint members. Between the conductor paths, the silver particles are far enough apart that no substantial electric current can flow between them. This ensures the individual addressability of the emitters. This process of adhesive joining is called anisotropic electrically conductive gluing.

Figure 3:
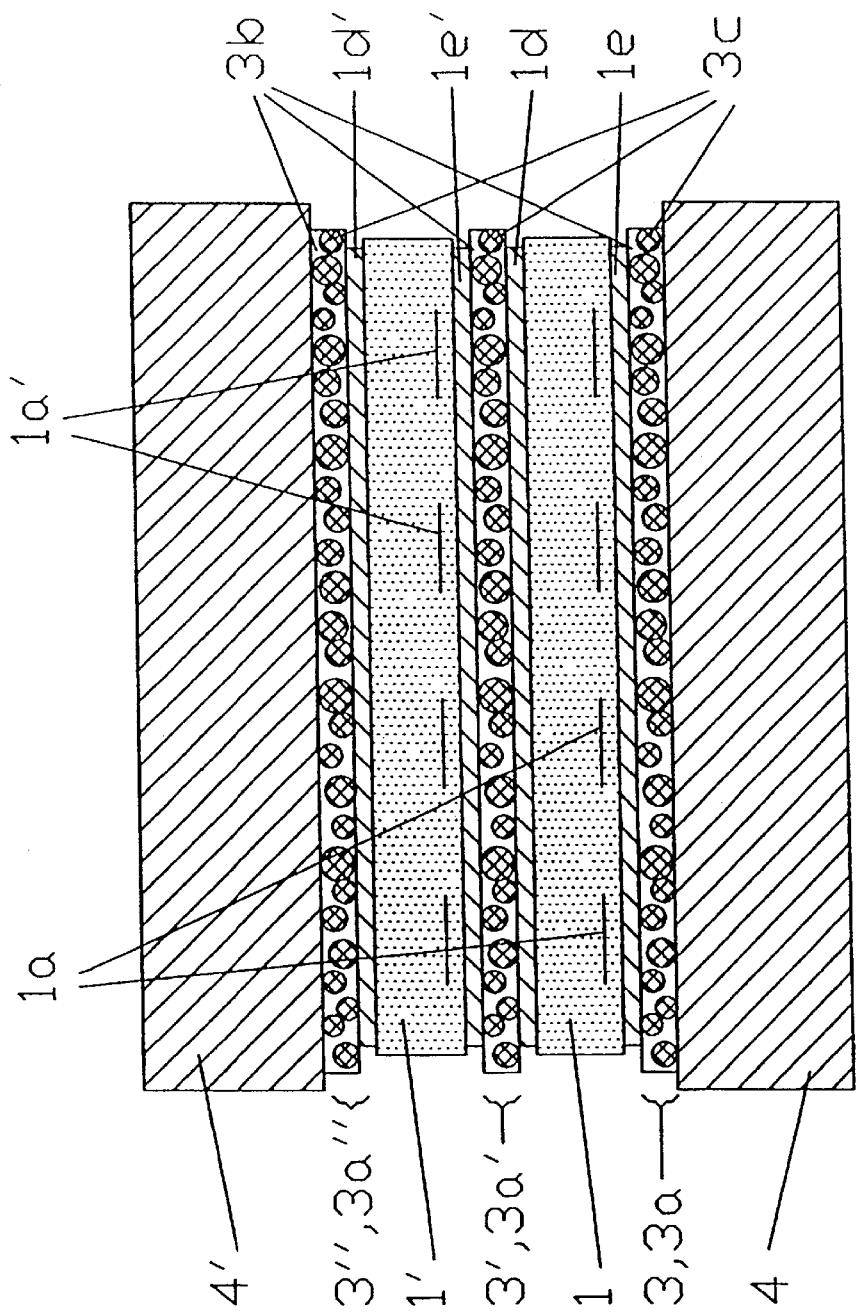
FIG. 3 shows a third embodiment example of an arrangement according to the invention of an HDL for pulsed operation with two HDBs, comprising an electrical contact which is constructed as a first HDB, a second HDB and an adhesive-containing joint zone which connects the two together.

The third embodiment example shown in FIG. 3 shows an HDL (6) which is provided for pulsed operation with 1 ms pulses at 1 Hz repetition frequency with two HDBs (1, 1') comprising two n-doped GaAs substrates with a thickness of 100 m on which ternary or quaternary semiconductor heterostructures having the function of pn junctions to laser emitters (1a, 1a') formed with terminating p-doped GaAs layer have been epitaxially grown. The substrate-side (n-side) surface is the cathode (1b, 1b') of the HDB and the epitaxy-side (p-side) surface is the anode (1c, 1c'). The cathode carries a metallization (1d, 1d') and the anode carries a metallization (1e, 1e').

A copper carrier (4) serves as electrical p-contact of minor thermal function for the first HDB (1) and is provided with a layer of joining material (3a) which, in addition to an adhesive (3b), contains electrically conductive particles (3c) of gold smaller than 2 μm. The cathode metallization (1d, 1d') of the first HDB (1) and second HDB (1') are provided with the same joining material portions (3a', 3a"). The first HDB (1) is pressed on the p-side into the layer of joining material (3a) of the copper carrier (4), the second HDB (1') is the n-contact of minor thermal function for the first HDB (1) and is pressed on the p-side into the layer of joining material (3a') at the cathode metallization (1d) of the first HDB (1). At the same time, the first HDB (1) is the p-contact of minor thermal function for the second HDB (1'). A second copper carrier (4') is the n-contact of minor thermal function for the second HDB (1') and is pressed into the layer of joining material (3a") at the cathode metallization (1d') of the second HDB (1'). The curing of the glue (3b) is effected at room temperature and leads to the material-engagement connection of all four joint members. In every case, the three joint zones (3, 3', 3") having thicknesses ranging from 2 to 4 μm.

A preferred further development of the third embodiment example consists in the use of additional, i.e., more than two, HDBs in the HDB stack.

While the foregoing description and drawings represent the present invention, it will be obvious to those skilled in the art that various changes may be made therein without departing from the true spirit and scope of the present invention.

what is claimed is:

1. A high-power diode laser bar-contact arrangement, comprising:

a high-power diode laser bar (HDB);

an electrical contact through which at most one third of the thermal output generated in the HDB in continuous wave (cw) operation is dissipated;

a joint zone between the HDB and the electrical contact, said joint zone containing a joining material with an adhesive; and wherein the electrical contact is a metal film having a thickness of less than 100 $\mu$m.

2. The high-power diode laser bar-contact arrangement according to claim 1, wherein the electrical contact is a substrate-side electrical contact for the HDB.

3. The high-power diode laser bar-contact arrangement according to claim 1, wherein the metal film has contact leads, openings, grooves or notches.

4. The high-power diode laser bar-contact arrangement according to claim 1, wherein the HDB is provided with at least one electrically conductive layer.

5. The high-power diode laser bar-contact arrangement according to claim 1, wherein the joint zone has a layer thickness of less than 100 $\mu$m.

6. The high-power diode laser bar-contact arrangement, comprising:

a high-power diode laser bar (HDB);

an electrical contact through which at most one third of the thermal output generated in the HDB in continuous wave (cw) operation is dissipated;

a joint zone between the HDB and the electrical contact, said joint zone containing a joining material with an adhesive; and wherein the electrical contact is an epitaxy-side electrical contact with an electrical separate conductor path for every emitter in HDB.

7. The high-power diode laser bar-contact arrangement according to claim 6, wherein the joint zone is anisotropically electrically conductive.

8. The high-power diode laser bar-contact arrangement according to claim 6, wherein the HDB is provided with at least one electrically conductive layer.

9. The high-power diode laser bar-contact arrangement according to claim 6, wherein the joint zone has a layer thickness of less than 100 $\mu$m.

* * * * *